Figure 1:
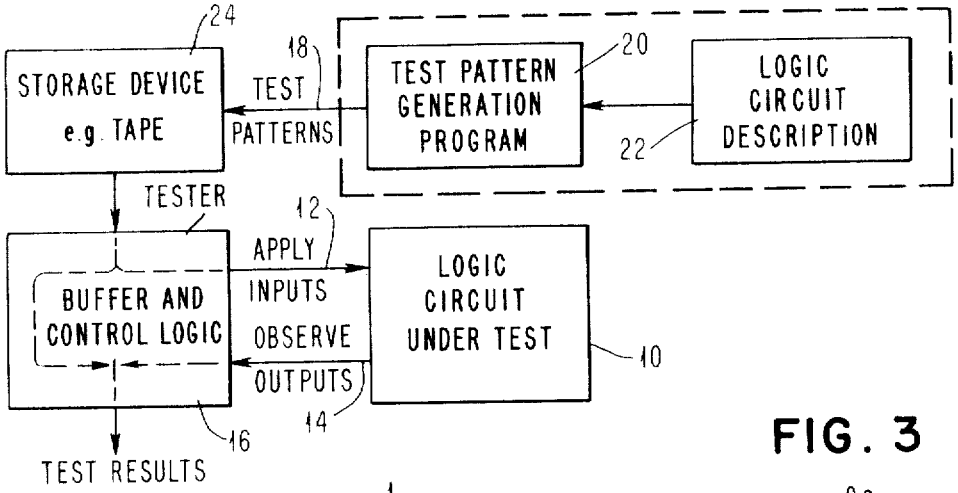
Figure 2:
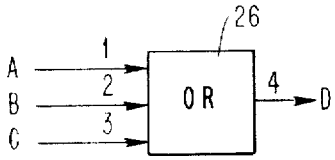
Figure 3:
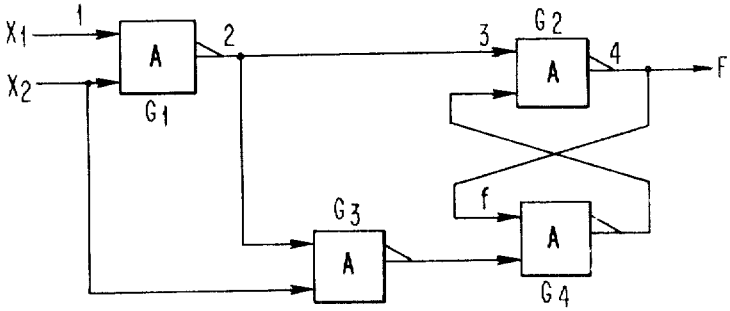
Figure 4:
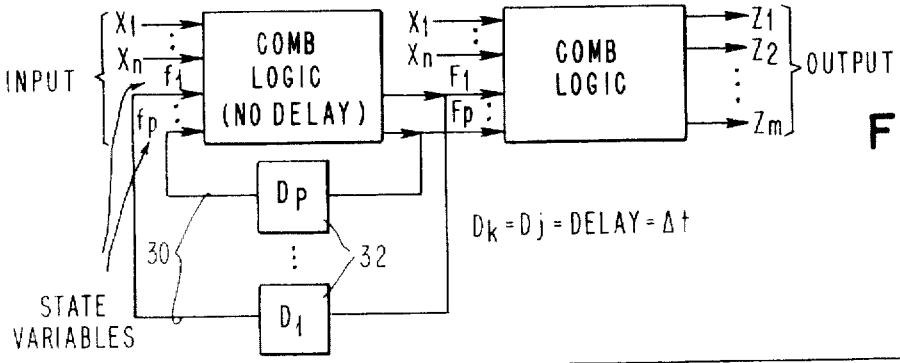
Figure 6:
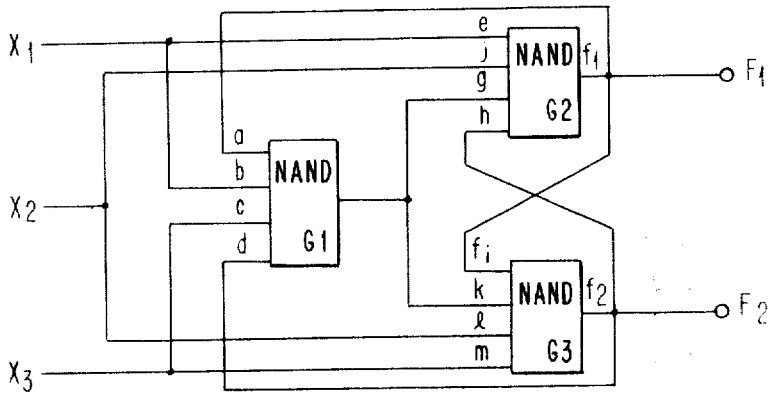
Figure 5:
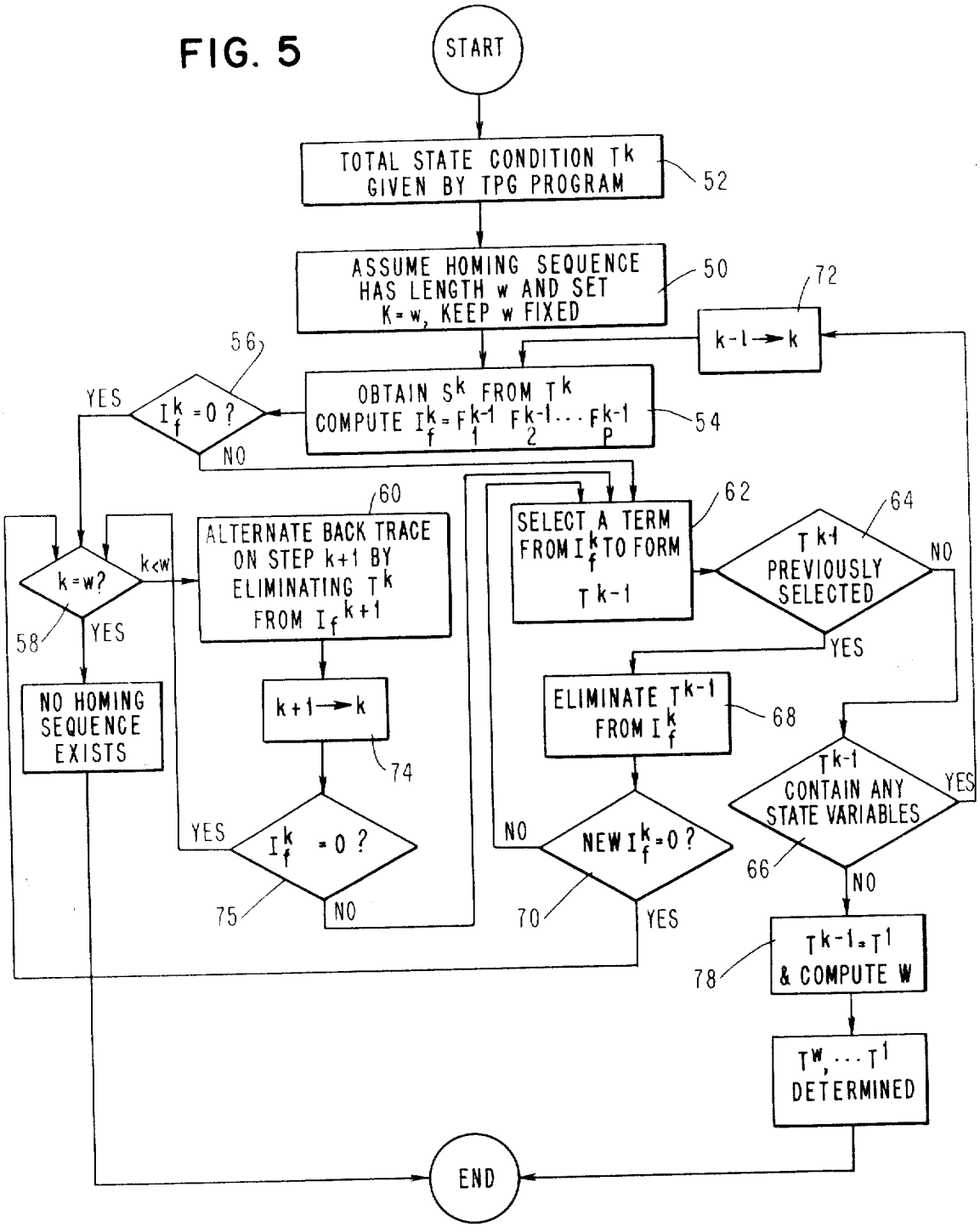

DEFENSIVE PUBLICATION

UNITED STATES PATENT OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent Office makes no assertion as to the novelty of the disclosed subject matter.

PUBLISHED JANUARY 7, 1975

930 O.G. 116

T930,005

METHOD FOR PLACING AN ASYNCHRONOUS SEQUENTIAL CIRCUIT INTO A STATE FOR TESTING

Dennis K. Chia, New Paltz, and Mu-Yue Hsiao, Poughkeepsie, N.Y., assignors to International Business Machines Corporation, Armonk, N.Y.

Continuation of abandoned application Ser. No. 265,035, June 21, 1972. This application Feb. 21, 1974, Ser. No. 444,449

**Int. Cl. G06f *15/20***
U.S. Cl. 444—1
2 Sheets Drawing. 23 Pages Specification

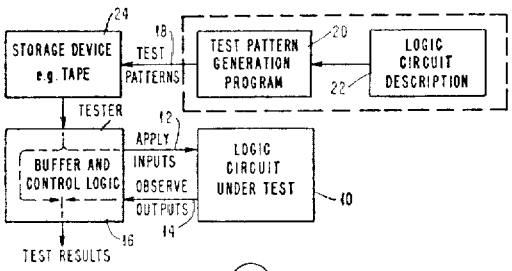

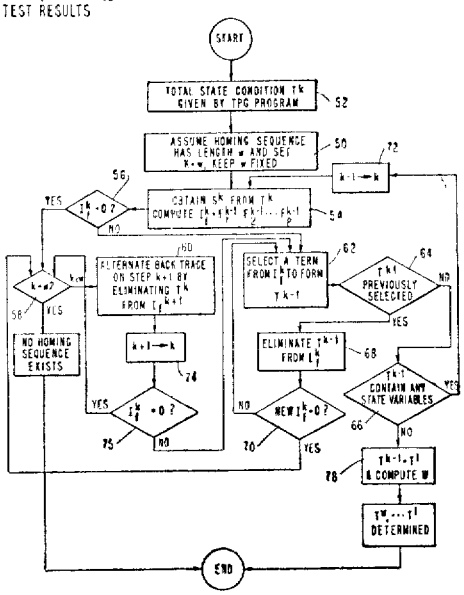

A method for determining the homing sequence input patterns required to place any asynchronous sequential circuit into a set-state for testing is provided. The set-state is determined from the total states of an asynchronous sequential circuit generated by any test pattern generating machine, then deriving the total-state sequence from said set-state in a reverse order starting with the last total-state. The end of the total-state sequence is determined by recognizing the total-state in which there are no state variables. The total-state input patterns generated from this method are utilized in the forward order to place the asynchronous sequential machine into said set-state regardless of the initial state of said asynchronous sequential circuit.